United States Patent [19]

Malaviya

[11] 3,899,753

[45] Aug. 12, 1975

[54] CONTROLLED HIGH FREQUENCY TRANSISTOR CRYSTAL OSCILLATOR

[75] Inventor: Shashi D. Malaviya, Fishkill, N.Y.

[73] Assignee: International Business Machines Corporation, Armonk, N.Y.

[22] Filed: May 6, 1974

[21] Appl. No.: 466,942

[52] U.S. Cl........... 331/109; 331/113 R; 331/116 R; 331/117 R

[51] Int. Cl.$^2$ ............................................ H03B 5/36

[58] Field of Search........ 331/109, 116 R, 159, 183, 331/113 R, 117 R

[56] References Cited

UNITED STATES PATENTS 3,824,491 7/1974 Treadway ........................... 331/109

*Primary Examiner*—Siegfried H. Grimm
*Attorney, Agent, or Firm*—Henry Powers

[57] ABSTRACT

A series-resonant crystal provides ac emitter coupling for a current switch whose output is fed back to its input to sustain oscillations at the resonant frequency of the crystal. A mixer circuit is provided so that the feedback is positive for small signal amplitudes whereby oscillations build up spontaneously when the circuit is switched on and then controls the feedback automatically so that it becomes negative for large signal amplitudes. This limits the output without resort to device saturation or cut-off, both of which adversely affect the speed, and as such, limit the high frequency performance of the oscillator.

5 Claims, 3 Drawing Figures

CONTROLLED HIGH FREQUENCY TRANSISTOR CRYSTAL OSCILLATOR

BACKGROUND OF THE INVENTION

The invention relates to crystal-controlled oscillators for use in stable timing and clock circuits in digital computers and other data processing as well as communication systems, and more particularly to the use of such oscillators with integrated circuits.

DESCRIPTION OF THE PRIOR ART

Crystal-controlled oscillators are well known and have been extensively used in the prior art. For example, crystal-controlled oscillators are the subject matter of the following patents:

| Inventor | Patent No. | Issue Date |
|---|---|---|
| Peterson | 2,557,310 | 6-19-51 |
| Kreitz | 3,684,981 | 8-15-72 |

The circuits of the prior art suffer from a serious disadvantage which limits their applicability to a relatively lower range of frequencies. More specifically, in the prior art there is no provision to reduce the positive feedback with increase in the amplitude of oscillations, except by forcing the active devices into either cut-off or saturation or both. Both saturation and/or cut-off are, however, undesirable because they slow down the circuit by reducing the effective cut-off frequency $f_t$ of the transistor and/or by increasing node capacitances. In some cases, special elements such as thermistors and diodes are used to limit the amplitude of oscillation without encountering the disadvantages of cut-off and saturation but the technique suffers from the disadvantages of added cost and complexity. Also, in the case of the thermistors, the cost becomes prohibitive for several applications because a thermistor cannot be easily fabricated as part of the standard integrated bipolar process.

SUMMARY OF THE INVENTION

The present invention provides a novel solution of the problem encountered in the prior art, namely reduction of the positive feedback with increase in amplitude of oscillation in a simple, low cost, but effective manner. As a matter of fact, the present invention not only reduces the positive feedback to zero but actually converts it to a negative feedback, when the amplitude becomes high. A very effective means of controlling the amplitude of oscillations is thereby obtained and the other disadvantages of the prior art are also eliminated in the process.

Other objects and advantages of the present invention are inherent in the structure and mode of operation disclosed and/or will be apparent to those skilled in the art as the detailed description proceeds. In particular, the invention is well suited for largescale integration on a chip, using the standard bipolar process.

DETAILED DESCRIPTION OF THE PRIOR ART

Because of the vast literature available on the subject, it is impractical to illustrate all possible variations covered by prior art, but the above two examples would suffice to explain the crucial differences between the present invention and the prior art.

Figure 1:
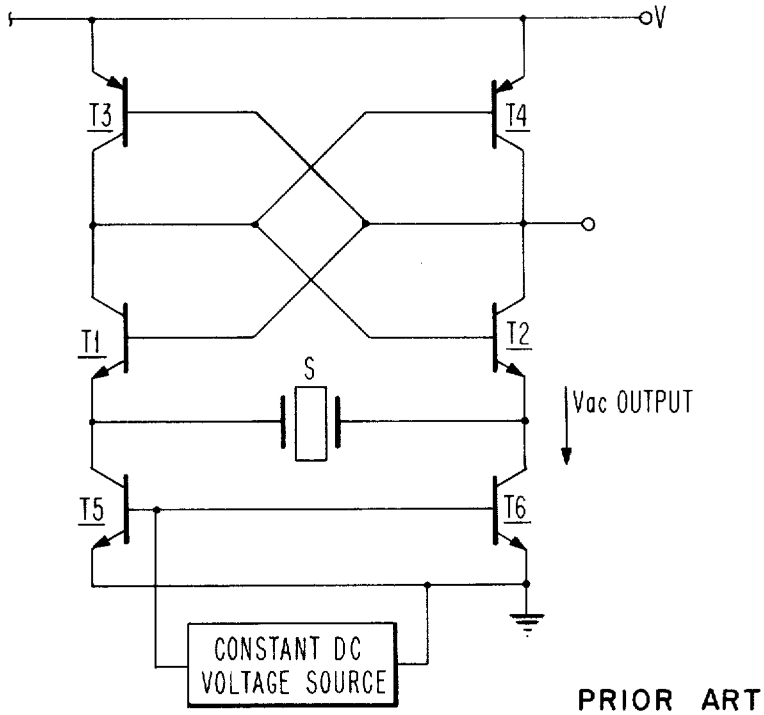
PRIOR ART FIG. 1
FIG. 1 shows an example of prior art.

Referring to FIG. 1, transistors $T_1$ and $T_2$ constitute a current switch whose emitters are ac coupled through the crystal $s$. $T_3$ and $T_4$ act as collector loads for $T_1$ and $T_2$. The outputs of $T_1$ and $T_2$ are fed back directly to the inputs (bases) of $T_2$ and $T_1$, respectively, providing strong positive feedback. However, the circuit does not have any means of limiting the feedback with increase in amplitude except by cut-off and/or saturation of the transistors. For example, when the collector of $T_1$ goes up to the positive supply V (or close to it), the collector of $T_2$ will be down. $T_3$ therefore gets saturated whereas $T_4$ is cut-off. Similar arguments show that $T_1$ and $T_2$ will also be alternately saturated and cut-off. $T_5$ and $T_6$ supply essentially constant dc current to the circuit.

The disadvantages of the prior art enumerated earlier are thus clearly visible in this circuit.

Figure 2:
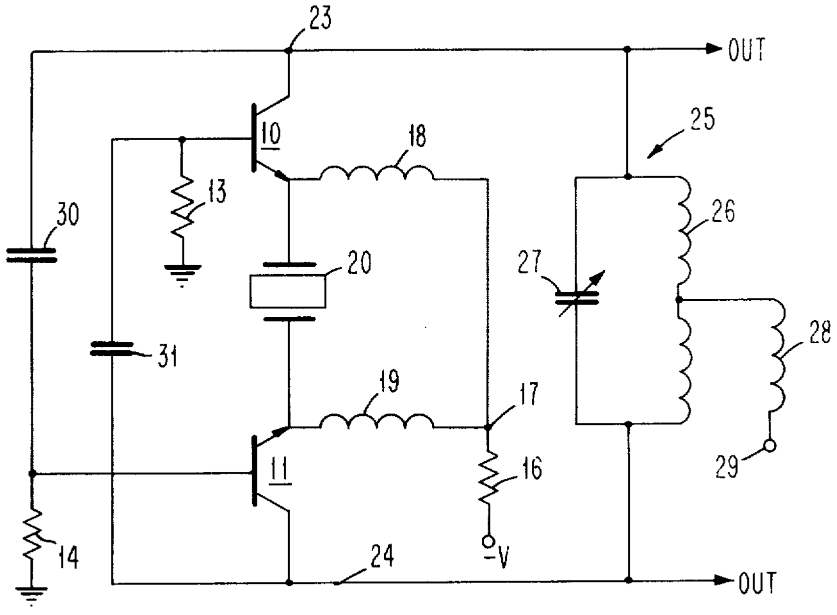
FIG. 2 PRIOR ART
FIG. 2 shows another example of prior art, more specifically a circuit utilizing vacuum tubes redrawn here with transistors.

Referring to FIG. 2, the circuit includes resistors 13 and 14 which provide dc bias to the bases of transistors 10 and 11 (ground in this case); a bias resistor 16, which biases the emitters negatively from −V; inductances 18 and 19 connected to respective emitters of transistors 10 and 11, with the common 17 connected to resistor 16 and a tank circuit 25 comprised of an inductance 26 shunted by a tuning capacitor 27 with inductor 26 center tapped through a choke 28 to a positive power supply terminal 29.

Again referring to FIG. 2, 10 and 11 constitute the "current switch" whose emitters are ac coupled through the crystal 20. The outputs of 10 and 11 are fed back to the inputs of 11 and 10 through series capacitors 30 and 31, respectively. Here again, there is no means of limiting the feedback except by saturation and/or cut-off of the transistors.

The disadvantages of the prior art are again visible here.

Similar inferences can be drawn in the case of other variations of the circuits encountered in prior art.

DESCRIPTION OF THE PREFERRED EMBODIMENTS

Figure 3:
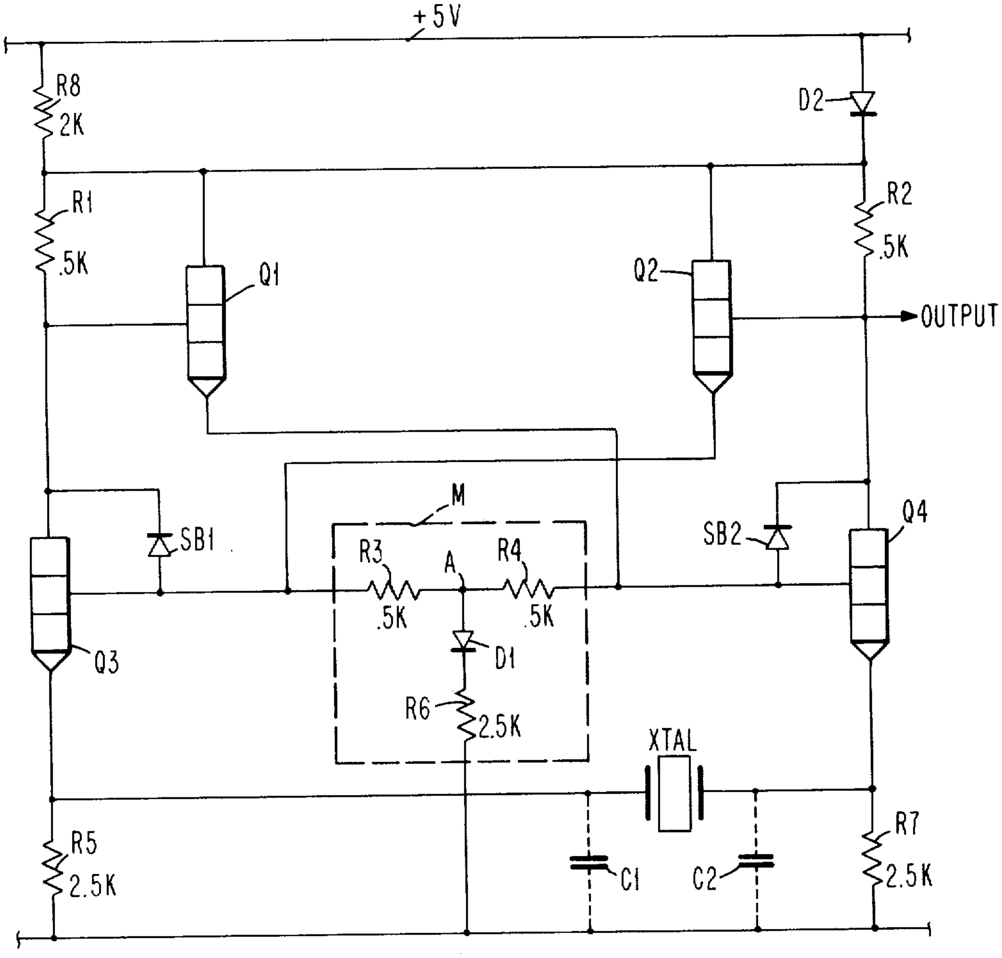
FIG. 3 shows the circuit diagram of the present invention.

FIG. 3 shows the preferred embodiment of the present invention. Q3 and Q4 constitute a current switch whose emitters are ac coupled by the crystal XTAL. The stray wiring capacitances associated with the two crystal pins are indicated in phantom as C1 and C2. Note that both capacitance C1 and C2 act as loads at the output of the two emitter followers Q3 and Q4. By avoiding connection of the crystal XTAL to high impedance points such as a base or a collector, circuit delays have been reduced to a point that oscillations such as at 55.25 MHz are readily obtained.

The output of Q3 is buffered by Q1 and fed to Q4, and the output of Q4 is buffered by Q2 and fed to Q3. Resistors R3 and R4 provide dc negative feedback which tends to stabilize the dc operating points of Q3 and Q4. Diode D1 and resistor R6 also provide a dc path for buffers Q1 and Q2. Furthermore, R6 and D1, with resistors R3 and R4, form a mixer circuit indicated as M in FIG. 3. The collector capacitance of D1 provides a partial r.f. bypass to ground which is helpful for high frequency oscillation.

Specifically, the outputs of Q3 and Q4 are fed back to the inputs of Q4 and Q3, respectively, via emitter followers Q1 and Q2 to provide the customary positive feedback of the prior art. However, the same outputs are also fed back to their own inputs to provide negative feedback. For example, the output of Q3 is available at the emitter of Q1 and is fed back to the base of Q3 via R4 and R3 (of the mixer circuit M), thus providing negative feedback. A similar situation exists for Q4. As explained below, the positive feedback dominates when the amplitude of oscillations is small, whereas the negative feedback takes over when the amplitude is high. A detailed explanation is as follows:

Case A: Small Amplitude

When the amplitude of oscillations is small, the increase in current in R3 is equal to the decrease in current in R4 and vice-versa, so that the net current in D1 remains constant. This means that the voltage at node A (junction of R3 and R4) remains constant. With the voltage at node A fixed (ac wise), there is no negative feedback from the emitter of Q1 to the base of Q3, or from the emitter of Q2 to the base of Q4 (because a change in the emitter of Q1 is cancelled out by equal but opposite change in the emitter of Q2). However, strong positive feedback exists from the emitter of Q1 to the base of Q4 and from the emitter of Q2 to the base of Q3, in spite of the voltage at node A being fixed.

Case B: Large Amplitude

When the amplitude becomes large, an increase in the current in R3 is no longer fully compensated by the decrease in the current in R4, because of the inherent non-linear $V_{BE}$ versus $I_E$ characteristics of transistors. The net result is that the effect of the increase in the emitter voltage of Q1 is no longer fully compensated by the decrease in the emitter voltage of Q2 and the voltage at node A therefore rises, which in turn leads to a rise in the voltage at the base of Q3 via R4 and R3, thereby causing negative feedback. The effect gets more pronounced as the amplitude increases.

It will thus be seen that the amplitude of oscillations can be stabilized by a self-adjusting feedback loop, without requiring saturation or cut-off of the main oscillator circuit consisting of the current switch Q3/Q4. R5 and R7 provide dc bias to Q3 and Q4. These can be replaced by constant current sources such as collectors of transistors with their bases biased with a suitable dc source.

From the foregoing, it can be seen that for small signals, with the node A held at a fixed voltage (ac wise), resistors R3 and R4 provide a small time constant discharge path for the emitters of transistors Q1 and Q2 and, as such, eliminate the necessity of providing short time constant loads directly to ground (e.g. by making resistor R6 very small, as for example, about 1K, which would increase dc power dissipation).

At the frequency of series resonance (for example 55.25 MHz of the crystal), the emitters of Q3 and Q4 are practically short-circuited via crystal XTAL. The two transistors therefore act as cross-coupled multivibrators at that frequency and the circuit oscillates. The crystal XTAL will act as an open circuit at other frequencies, preventing oscillations at all other frequencies.

Finally, by placing the crystal XTAL across the emitters of Q3 and Q4, the ac voltage swing between the crystal pins and ground has been made very small, with the result that the stray capacitances C1 and C2 do not have time to charge and discharge to any great extent. The associated charging/discharging time (for a given charging current) is thus minimized and circuit performance improved.

The diode D1 is used to conserve space if embodied on an integrated circuit chip, but is not essential for the basic operation of the circuit.

Similarly, diode D2 and resistor R8 are used to reduce the operating voltage level and are not essential for the operation of the circuit.

Furthermore, emitter followers Q1 and Q2 improve the speed of operation by acting as buffers for the outputs of Q3 and Q4.

R1 and R2 are the collector load resistors for respective transistors Q3 and Q4. Outputs of Q3 and Q4 are thus available across resistors R1 and R2 and are fed to respective emitter follower buffer transistors Q1 and Q2.

The Schottky barrier diodes SB1 and SB2 are connected across the base-collector junctions of their respective transistors Q3 and Q4 to prevent saturation of their collectors due to excessive voltage drops across load resistors R1 and R2. (SB are conventional designations for Schottky barrier diodes).

While the invention has been particularly shown and described with reference to the preferred embodiments thereof, it will be understood by those skilled in the art that the foregoing and other changes in form and detail may be made therein without departing from the spirit and scope of the invention.

What is claimed is:

1. A controlled amplitude oscillator comprising:
   a. collector-to-base cross-coupled first and second transistors;
   b. a piezoelectric crystal connected between the emitters of said first and second transistors; and
   c. a mixer circuit connected between the bases of said first and second transistors, wherein said mixer circuit comprises
   d. two like resistors connected in series between said bases; and
   e. a third resistor connected from the common junction of said like resistors to a reference potential.

2. the oscillator of claim 1 wherein said third resistor has a higher resistance than said like resistors.

3. A controlled amplitude oscillator comprising:
   a. collector-to-base cross-coupled first and second transistors;
   b. a piezoelectric crystal connected between the emitters of said first and second transistors; and
   c. a mixer circuit connected between the bases of said first and second transistors including an emitter follower-transistor in each arm in the cross-coupling network between the collector output of one of said first and second transistors and the base of the other of said transistors.

4. The oscillator of claim 3 wherein said mixer circuit comprises
   a. two like resistors connected in series between said bases, and
   b. a third resistor connected from the common junction of said like resistors to a reference potential.

5. The oscillator of claim 4 wherein said third resistor has a higher resistance than said like resistors.

* * * * *